United States Patent
Riley et al.

(10) Patent No.: US 11,915,775 B2
(45) Date of Patent: Feb. 27, 2024

(54) APPARATUSES AND METHODS FOR BAD ROW MODE

(71) Applicant: MICRON TECHNOLOGY, INC., Boise, ID (US)

(72) Inventors: Jack Riley, Boise, ID (US); Scott Smith, Boise, ID (US); Christian Mohr, Boise, ID (US); Gary Howe, Boise, ID (US); Joshua Alzheimer, Boise, ID (US); Yoshinori Fujiwara, Boise, ID (US); Sujeet Ayyapureddi, Boise, ID (US); Randall Rooney, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/449,297

(22) Filed: Sep. 29, 2021

(65) Prior Publication Data
US 2023/0096291 A1   Mar. 30, 2023

(51) Int. Cl.
*G11C 29/44* (2006.01)
*G11C 29/00* (2006.01)
*G11C 29/18* (2006.01)
*G11C 29/46* (2006.01)
*G11C 29/12* (2006.01)

(52) U.S. Cl.
CPC ......... *G11C 29/4401* (2013.01); *G11C 29/18* (2013.01); *G11C 29/46* (2013.01); *G11C 29/76* (2013.01); *G11C 29/787* (2013.01); *G11C 2029/1202* (2013.01)

(58) Field of Classification Search
CPC ..... G11C 29/4401; G11C 29/18; G11C 29/46; G11C 29/76; G11C 29/787; G11C 2029/1202
See application file for complete search history.

(56) References Cited

U.S. PATENT DOCUMENTS

| | | | |
|---|---|---|---|
| 9,343,184 B2 * | 5/2016 | Wilson | G11C 29/789 |
| 9,997,257 B1 * | 6/2018 | Lee | G11C 29/76 |
| 10,770,164 B1 * | 9/2020 | Baughen | G11C 29/38 |
| 11,435,940 B2 * | 9/2022 | Schat | G06F 3/0653 |
| 2015/0135038 A1 | 5/2015 | Wilson et al. | |
| 2016/0372214 A1 | 12/2016 | Shim | |
| 2017/0075632 A1 | 3/2017 | Mozak et al. | |

(Continued)

OTHER PUBLICATIONS

International Search Report & Written Opinion dated Dec. 22, 2022 for PCT Application No. PCT/US2022/076330.

*Primary Examiner* — Vanthu T Nguyen
(74) *Attorney, Agent, or Firm* — Dorsey & Whitney LLP

(57) ABSTRACT

Embodiments of the disclosure are drawn to apparatuses and methods for bad row mode. The memory may prevent proper access operations (e.g., read operations) from being performed on a selected bad row of the memory as part of a bad row mode. For example, the memory may store a bad row address and when an access address matches the bad row address, may suppress one or more signals, change data read from the address, or combinations thereof. The bad row mode may be used to provide a positive control for post package repair (PPR) operations on the memory. A controller may enter the memory into bad row mode and then test the memory to determine if the selected bad row can be located and repaired via PPR.

21 Claims, 6 Drawing Sheets

(56) References Cited

U.S. PATENT DOCUMENTS

2017/0256326 A1    9/2017  You
2018/0107597 A1*  4/2018  Jo ........................ G06F 13/1647
2019/0019569 A1    1/2019  Pope
2020/0243158 A1    7/2020  Wilson

* cited by examiner

APPARATUSES AND METHODS FOR BAD ROW MODE

BACKGROUND

This disclosure relates generally to semiconductor devices, and more specifically to semiconductor memory devices. In particular, the disclosure relates to memory, such as dynamic random access memory (DRAM). Information may be stored in memory cells, which may be organized into rows (word lines) and columns (bit lines). At various points in manufacturing and use of a memory device, one or more memory cells may fail (e.g., become unable to store information, be inaccessible by the memory device, etc.) and may need to be repaired.

The memory device may perform repair operations on a row-by-row basis. A row containing a failed memory cell (which may be referred to as a defective row, a bad row, or a faulty row) may be identified. The memory device may contain additional rows of memory (which may also be referred to as redundant rows) which may be used in repair operations. During a repair operation, an address associated with the defective row may be redirected, such that the address points to a redundant row instead. It may be desirable to test the capability of the memory to detect and repair defective rows, without relying on the memory including an actual failed row.

DETAILED DESCRIPTION

Figure 1:
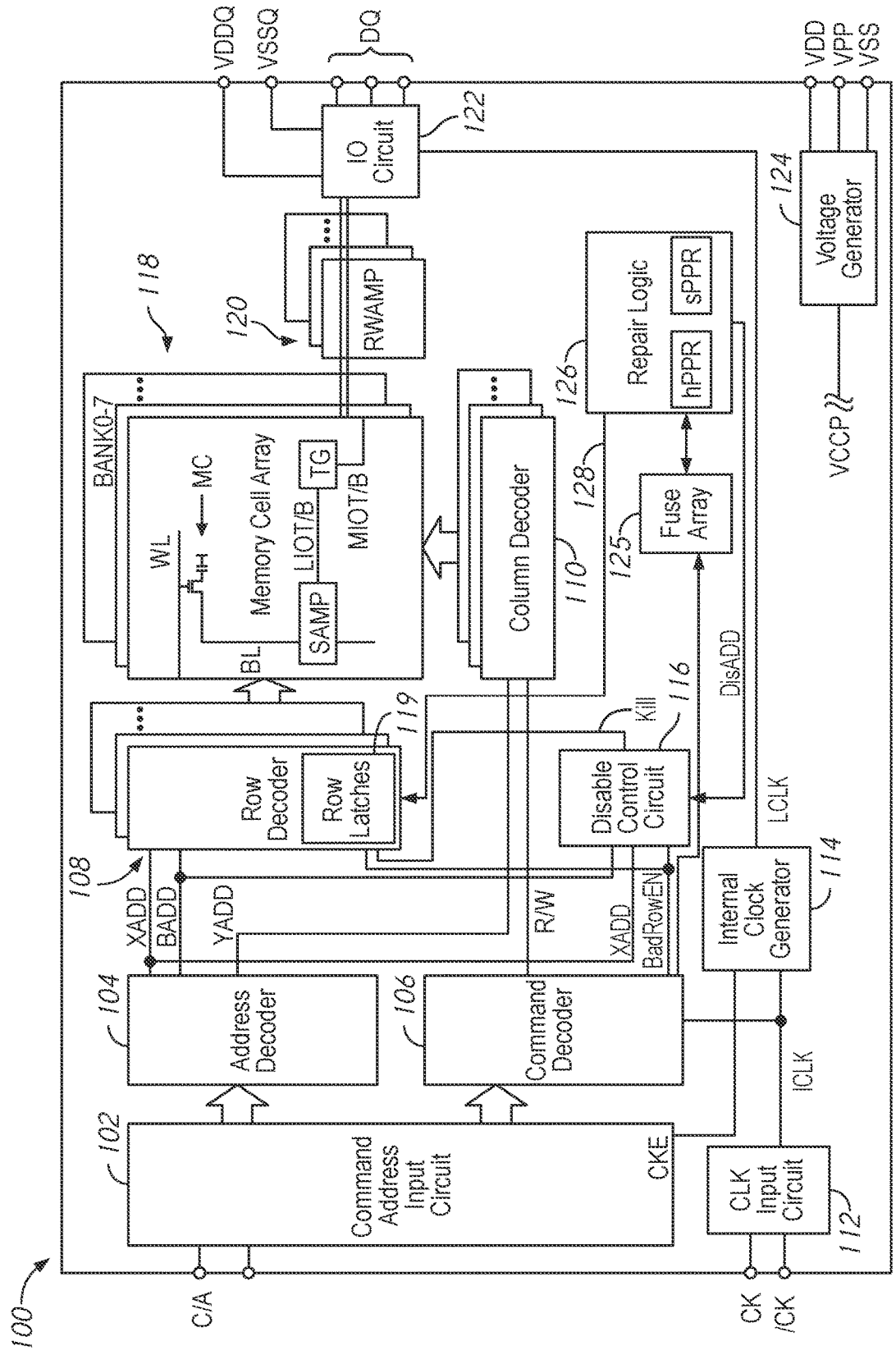
FIG. 1 is a block diagram of a semiconductor device according to some embodiments of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Semiconductor memory devices may store information in a plurality of memory cells. The information may be stored as a binary code, and each memory cell may store a single bit of information as either a logical high (e.g., a "1") or a logical low (e.g., a "0"). The memory cells may be organized at the intersection of word lines (rows) and bit lines (columns). The memory may further be organized into one or more memory banks, each of which may include a plurality of rows and columns. During operations, the memory device may receive a command and an address which specifies one or more rows and one or more columns and then execute the command on the memory cells at the intersection of the specified rows and columns (and/or along an entire row/column).

Certain memory cells may be defective, and rows containing the defective memory cells may generally be referred to as defective rows (or bad rows or faulty rows). The defective rows may be incapable of storing information and/or may become otherwise inaccessible to the memory device. In some cases, memory may become defective (and/or may be identified as defective) after the memory device is packaged (e.g., sealed in a chip package). The memory device may carry out one or more types of post-package repair (PPR) operations to resolve the defective rows. For example in a "hard" PPR operation (hPPR), fuses may be blown to permanently reprogram the logical row address so that it is associated with a new physical address (e.g., a redundant row instead of the original defective row). It may be useful to be able to test the controller's ability to detect and repair defective rows (and/or the memory's ability if internal testing circuits are used). However, it may be inefficient to wait for the memory to develop an error.

The present disclosure is generally directed to apparatuses, systems, and methods for bad row mode. The memory includes a bad row mode, which when activated causes a row to fail. The controller and/or memory may then detect the disabled row and repair it (e.g., using an hPPR operation). The memory may be tested to determine if the repair was properly made. For example, a controller may enter a memory device into a bad row mode and provide a disable address (and/or the memory may generate the disable address). When the memory receives an access address (e.g., as part of a read operation) which matches the disable address, a disable control circuit of the memory may cause the read operation to fail on the word line associated with the disable address (as long as the disable address has not been already repaired). For example, the memory may suppress signals such as ACT or COL, may change one or more of the read bits (e.g., by inverting the bits, by replacing the bits, by randomizing the bits, etc.), or combinations thereof.

FIG. 1 is a block diagram of a semiconductor device according to at least some embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row decoder 108 and the selection of the bit lines BL and /BL is performed by a column decoder 110. In the embodiment of FIG. 1, the row decoder 108 includes a respective row decoder for each memory bank and the column decoder 110 includes a respective column decoder for each memory bank. The bit lines BL and /BL are coupled to a respective sense amplifier (SAMP). Read data from the bit line BL or /BL is amplified by the sense amplifier SAMP, and transferred to read/write amplifiers 120 over complementary local data lines (LIOT/B), transfer gate (TG), and complementary main data lines (MIOT/B). Conversely, write data outputted from the read/write amplifiers 120 is transferred to the sense amplifier SAMP over the complementary main data lines MIOT/B, the transfer gate TG, and the complementary local data lines LIOT/B, and written in the memory cell MC coupled to the bit line BL or /BL.

The device also includes a fuse array 125, which contains a plurality of non-volatile storage elements (fuses) which may store information about addresses in the memory array 118. The fuse array may include a variety of non-volatile elements such as fuses and anti-fuses, which are referred to generically as fuses herein. Each fuse may start in a first state (e.g., an anti-fuse may be insulating), and may be 'blown' to permanently change the fuse's state (e.g., a blown anti-fuse may be conductive). Each fuse may be considered to be a bit, which is in one state before it is blown, and permanently in a second state after it's blown. For example, a fuse may represent a logical low before it is blown and a logical high after it is blown.

Specific groups of fuses may be represented by a fuse bank address FBA, which may specify the physical location of each of the fuses in the group within the fuse array 125. The group of fuses associated with a particular FBA may act as a row repair element (RRE). The RRE may be encoded with a row address to be repaired (e.g., by blowing fusing to encode a binary string of the row address). The RRE may be associated with a particular redundant row of the memory array 118. The address information in the fuse array 125 may be 'scanned' out along a fuse bus to row latches 119. Each row latch 119 may be associated with a particular wordline of the memory array 118. The address stored in a given RRE may be scanned out from the fuse array 125 along the fuse bus 128, and may be latched by a particular row latch 119. Each row latch 119 may act as a redundant row decoder and may compare the row address XADD to the stored address from the fuse bus. When there is a match, the redundant row may be accessed. In this manner, an address stored as an RRE the fuse array 125 may be associated with a particular row of the memory array 118. The address stored in the row latch 119 may then direct access commands to the wordlines associated with the row latch 119.

The fuse array 125 may be divided into different sections. For example, each bank of the memory array 118 may be associated with a fuse bank of the fuse array 125, which may store information related to that memory bank. Each fuse bank may have a number of RREs based on a number of repair operations (e.g., a number of redundant rows) which are associated with that memory bank.

The memory device 100 includes a repair logic circuit 126. The repair logic circuit 126 may include post package repair (PPR) circuits (e.g., hard PPR or hPPR circuits) which may be used to make changes to the fuse array 125. For example, the hPPR circuits may perform a hard repair, where fuses in an RRE the fuse array 125 are blown to 'repair' a row by encoding the repaired row address permanently into the RRE. The repair logic circuit 126 may also include soft PPR circuits (sPPR circuits) and volatile memory elements which may be used to make non-permanent repairs. The fuse logic circuit 126 may monitor the data along the fuse bus 128 and may selectively alter the data based on the data stored in the volatile storage elements. For example, the sPPR circuits may scan the fuse array 125 to locate an open RRE, and then when the fuse information is streamed to the row latches 119, the sPPR circuits may alter the data along the fuse bus so that the address stored in the volatile latches of the sPPR circuit are provided along the fuse bus to the row latches 119.

The memory device 100 includes a disable logic circuit 116. The disable logic circuit 116 may be used as part of a test operation. The disable logic circuit 116 may disable a selected row address (e.g., a bad row address or disable address) of the memory array 118 to prevent proper access operations (e.g., read operations) from being performed on that row address until it is repaired. The disable logic circuit 116 may only be active in a bad row mode of the memory 100. Various methods may be used to enter the memory 100 into the bad row mode. For example, a fuse setting, a command from a controller (e.g., a multi-purpose command), a mode register setting, or combination thereof.

When the bad row mode is active, the disable logic 116 may compare the address XADD to the selected bad row address. The bad row address may be provided by a controller, or may be generated on the memory 100. For example, the memory 100 may pre-set the bad row address, may randomly generate the bad row address or combinations thereof. When the address XADD matches the stored bad row address (and the bad row mode is active, and the row address XADD has not been previously repaired) the disable logic 116 provides a signal Kill at an active level. Responsive to the signal Kill being active, the row decoder 108 and/or column decoder 110 may prevent data from being properly read from the memory array 118. For example, responsive to the signal Kill being active, a command such as ACT or COL necessary to a proper read operation may be suppressed, the bits read from the memory array may be altered (e.g., set to a single value, randomized, inverted, etc.) or combinations thereof. If the repair logic 126 indicates that the selected bad row address has been repaired, then the signal Kill may be suppressed to allow for proper access of the redundant word line now associated with the address XADD.

In some embodiments, the disable logic 116 may share components and/or logic with the repair logic 126. For example, the disable address may be stored in volatile latches associated with the sPPR logic or may be stored in the fuse array, and the hPPR logic may be used.

The semiconductor device 100 may employ a plurality of external terminals that include command and address (C/A) terminals coupled to a command and address bus to receive commands and addresses, clock terminals to receive clocks CK and /CK, data terminals DQ to provide data, and power supply terminals to receive power supply potentials VDD, VPP, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a row activation command ACT. When the row activation command ACT is received, a bank address BADD and a row address XADD are timely supplied with the row activation command ACT.

The device 100 may receive an access command which is a read command. When a read command is received, a bank address BADD and a column address YADD are timely supplied with the read command, read data is read from memory cells in the memory array 118 corresponding to the row address XADD and column address YADD. For example, the row decoder may access the wordline associated with the row latch 119 which has an address which matches XADD. The read command is received by the command decoder 106, which provides internal commands so that read data from the memory array 118 is provided to the read/write amplifiers 120. The row decoder 108 may match the address XADD to an address stored in a row latch 119, and then may access the physical row associated with that row latch 119. The read data is output to outside from the data terminals DQ via the input/output circuit 122.

The device 100 may receive an access command which is a write command. When the write command is received, a bank address BADD and a column address YADD are timely supplied with the write command, write data supplied to the data terminals DQ is written to a memory cells in the memory array 118 corresponding to the row address and column address. The write command is received by the command decoder 106, which provides internal commands so that the write data is received by data receivers in the input/output circuit 122. The row decoder 108 may match the address XADD to an address stored in a row latch 119, and then access the physical row associated with that row latch 119. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC.

The power supply terminals are supplied with power supply potentials VDD, VPP, and VSS. The power supply potentials VDD, VPP, and VSS are supplied to an internal voltage generator circuit 124. The internal voltage generator circuit 124 generates various internal potentials such as VCCP.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
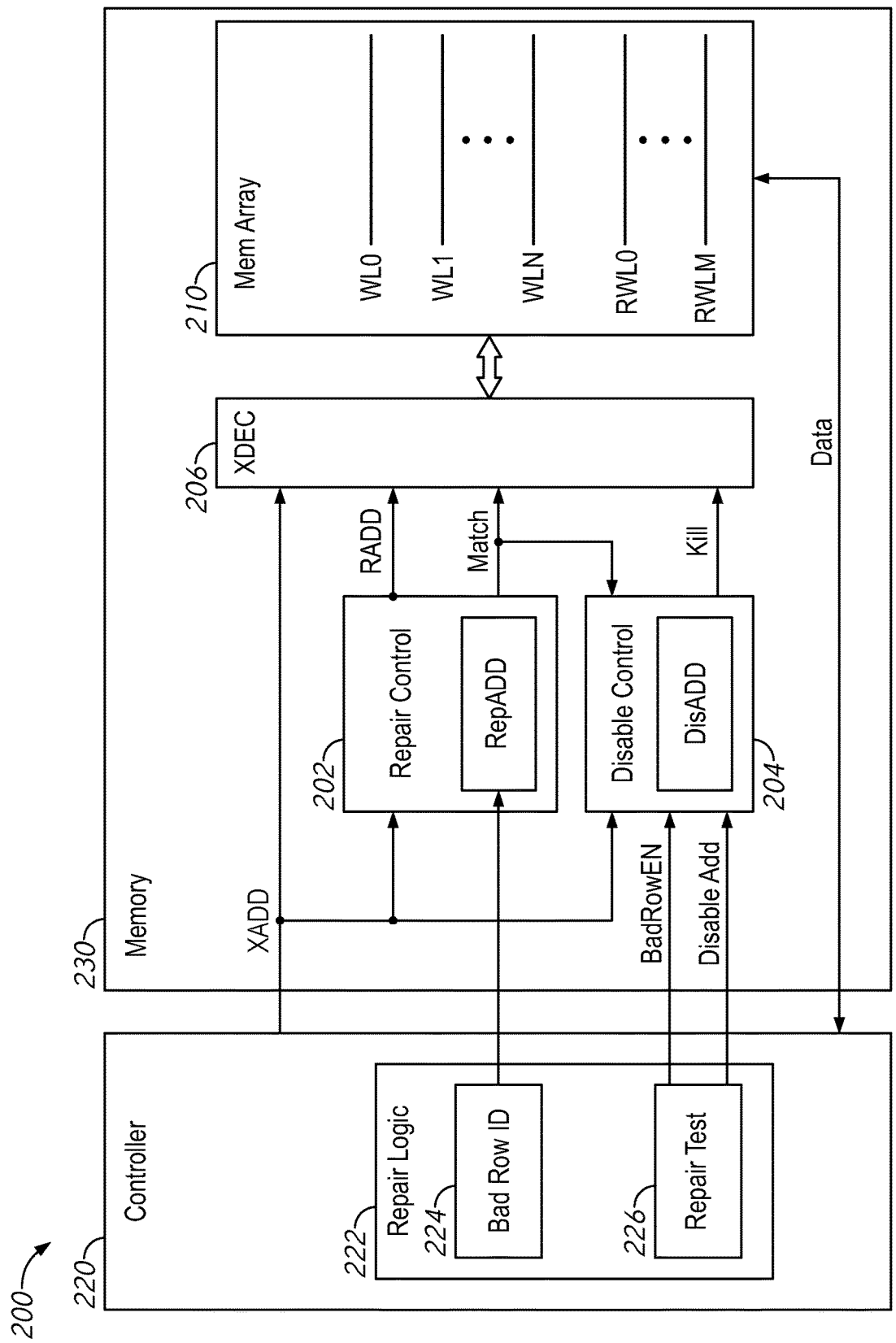
FIG. 2 is a block diagram of a system according to some embodiments of the present disclosure.

FIG. 2 is a block diagram of a system according to some embodiments of the present disclosure. The system 200 includes a memory 230 and a controller 220. The memory 230 of FIG. 2 may, in some embodiments, be included in the memory device 100 of FIG. 1. Only certain example components relevant to describing a bad row mode are shown in FIG. 2, other components may be present and may also interact with the bad row mode operation (e.g., column decoders, PPR circuits, fuse array, etc.).

The controller 220 may operate the memory 230. For example, the controller may provide access commands and addresses such as the row address XADD. The controller may also send and receive data to and from the memory array 210. For example a write operation may involve providing data along with a write command and various addresses, while a read command may involve providing commands and addresses and then receiving data read from the memory array.

The controller includes repair logic 222, which is used to identify defective rows of the memory array 210 so that they can be repaired by a repair control circuit 202 of the memory 230, for example as part of a post-package repair (PPR) operation. The repair logic 222 also includes a repair test circuit 226, which is used to test the operation of the repair logic 222. The repair test circuit 226 may activate a bad row mode (and optional provide a disable address DisADD), which in turn may cause the memory to disable a word line of the memory array 210. The controller 220 may then write test data to the memory array 210 and read the data to determine if the read data matches the written data. A bad row identification circuit 224 may compare the written and read data to locate a defective (or in the test case, disabled) row. Once located, the repair logic may provide an address of the defective/disabled row to the repair control circuit 202 and test to ensure that the repaired row now properly functions.

The memory includes a memory array 210 (e.g., memory array 118 of FIG. 1) includes a number of word lines, here labelled WL0 to WLN, and at least one redundant word lines RWL0 to RWLM. The labeling of the word lines WL0 to RWLM may represent physical addresses of those word lines. During operations, the memory 230 may receive row addresses XADD (e.g., logical addresses) from the controller 220, which may be mapped to the physical address space, such that each value of the row address is associated with a given physical address of a word line. A row decoder 206 may receive the row address XADD and then provide signals which activate the physical word line associated with that address.

The memory 230 includes a repair control circuit 202 (e.g., 126 of FIG. 1) which receives the row address XADD and compares the row address to stored repair addresses RepADD, to determine if the row address XADD has been repaired. The repair involves remapping the relationship of the logical row address XADD to the physical addresses of the wordlines in the memory. For example, if the row address XADD was previously associated with the word line WL0, after a repair operation it may instead be associated with a different word line, such as the redundant word line RWL1.

The repair addresses RepADD may be programmed into memory in non-volatile fashion. For example, a fuse array may be programmed with repair addresses. Each repair address may be programmed into a group of fuses which is associated with one of the redundant word lines. The fuses may be programmed, for example, during factory testing. After the memory is packaged onto a chip, post-package repair (PPR) operations may be performed to make further repairs. For example, hard post-package repair (hPPR) operations may involve further programming information into the fuse array. Soft post-package repair (sPPR) may involve storing repair addresses on volatile storage elements (e.g., latch circuits). The bad row identification circuit 224 of the controller 220 may identify rows for repair (e.g., based on writing and reading test patterns to the memory 230) and provide the repair address RepADD to the memory, either for storage in an hPPR or sPPR operation.

During access operations, when a row address is provided by the controller 220, the redundancy control circuit 202 compares the row address XADD to the stored repair addresses RepADD and provides a match signal Match at an active level if there is a match between the row address and any of the repaired address. The redundancy control circuit 202 may also supply information RADD which indicates which physical address the row address XADD is now associated with. The row decoder 206 may receive the remapped address RADD and the signal Match and if it is at an active level, may access the word line associated with RADD instead of the word line which would normally be associated with XADD.

The controller 220 may enter the memory 230 into a bad row mode as part of a test operation. The bad row mode being active causes a disable control circuit 204 (e.g., 116 of FIG. 1) to disable a word line associated with an address DisADD (as long as the address DisADD has not been repaired). The controller 220 may enter the memory 230 into the bad row mode, for example by providing a command, changing a mode register setting, changing a fuse, or combinations thereof. The bad row mode may be represented by an internal signal BadRowEN, which is active when the memory 230 is in the bad row mode. While the controller 220 is shown as directly providing the signal BadRowEN for sake of illustration, it should be understood that the controller 220 may enter the memory 230 into the bad row mode in any number of ways, and the signal BadRowEN may be a signal which is internal to the memory 230. The disabled row may act as a positive control for the repair logic 222 of the controller, to determine if the repair logic 222 can successfully locate and repair the disabled row.

In some embodiments, rather than a controller, a test circuit of the memory 230 may be used to perform the test operations. For example, a built-in self-test (BIST) circuit may perform the functions described with respect to the repair logic 222.

The disable control circuit 204 stores a disable address DisADD. The disable address DisADD may be provided by the controller 220 (e.g., by the repair test circuit 226), may be pre-set on the memory 230 (e.g., there may be a designated row for disabling on each bank of the memory array 210), may be generated (e.g., randomly) by the memory 230, or combinations thereof. If the disable control circuit 204 is enabled (e.g., a bad row enable BadRowEN signal is active) as part of a bad row mode, then when the row address XADD matches the disable address DisADD, the disable control circuit provides a kill signal Kill at an active level. Responsive to the kill signal Kill being active, the row decoder 206 may cause the access operation on the word line indicated by XADD to fail. For example, responsive to the kill signal Kill being active, the row decoder could force an illegal read operation, could suppress a signal such as an activate ACT or column signal COL, could invert or otherwise tamper with data read from the word line, or combinations thereof. When the controller 220 performs an access operation with a row address which matches the disable address DisADD, and the signal Kill is active, the data which is read from the word line will not match the data written to the word line. This will cause the bad row identification circuit 224 to determine that the disabled row is defective, and instruct the repair control circuits to repair the row, for example by providing the identified disabled row address DisADD as a repair address RepADD for repair as part of a PPR operation.

Although shown as separate components, the disable control circuit 204 may use portions of the redundancy control 202. For example, the disabled address DisADD may be stored in a storage structure which would normally be used to store a repair address RepADD, but which is used to store the disable address DisADD when a bad row mode is active (e.g., when BadRowEN is active). In some embodiments, the disabled word line may be temporarily disabled. For example, if the disable control circuit 204 takes advantage of volatile latches, such as those used in sPPR operations, then the address DisADD may be cleared by resetting (e.g., power cycling) the device, which may restore functionality to the disabled word line. In some embodiments, the disabled word line may be permanently disabled. For example if the disable control circuit 204 takes advantage of non-volatile storage, such as those used in hPPR, then the word line associated with DisADD may be permanently disabled (e.g., fail to provide proper data upon access operations) until the row DisADD is repaired (e.g., the address DisADD is identified and stored as a repair address RepADD).

The disable control circuit 204 may also receive the signal Match from the repair control circuit. When the signal Match is active (indicating that the row address XADD has been repaired), the disable control circuit 204 may keep the signal Kill inactive. This may prevent the disable control circuit 204 from disabling the repaired word line after a repair has been performed.

Figure 3:
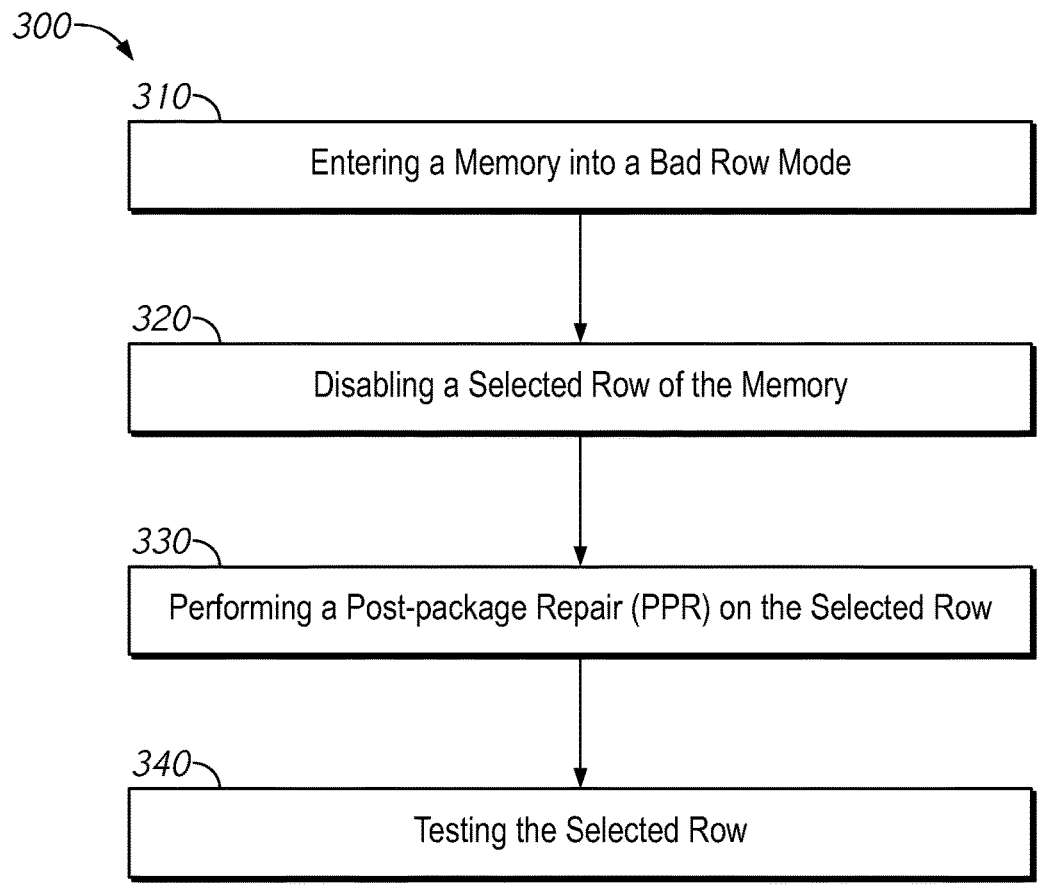
FIG. 3 is a flow chart of a method according to some embodiments of the present disclosure.

FIG. 3 is a flow chart of a method according to some embodiments of the present disclosure. The method 300 may be implemented by any of the systems or apparatuses described herein.

The method 300 includes box 310, which describes entering a memory device (e.g., 100 of FIG. 1) into a bad row mode. The bad row mode is a mode of the memory in which a selected row is disabled as a positive control for row repair operations, such as PPR operations. Entering the bad row mode may involve issuing a command to a memory (e.g., from a controller), setting a mode register value of the memory, changing the state of fuses of the memory, or combinations thereof. However the bad row mode is entered, the method 300 may include providing a bad row mode enable signal at an active level while the bad row mode is active.

The method 300 includes box 320, which describes disabling a selected row of the memory. The method 300 may include designating the selected row. For example, the row may be randomly selected or the selected row may be received from a controller. In some embodiments, the selected row may be pre-set on the memory. The method 300 may include storing a selected row address. The selected row address may be stored in an sPPR latch. The selected row address may be stored in a fuse array (e.g., programmed in using an hPPR operation). A repair test circuit (e.g., 226 of FIG. 2) of the controller may provide commands (along with the optional selected bad address) causing the memory to store the selected address in a disable control circuit (e.g., 116 of FIG. 1 and/or 204 of FIG. 2).

The disabling described in box 320 includes comparing an access address to the selected row address and providing a kill signal at an active level responsive to a match between the access address and the selected address (e.g., with a disable control circuit such as 204 of FIG. 2). The comparison between the access address and the selected address may only be enabled if the bad row mode is active (e.g., if a bad row mode enable signal is active).

Responsive to the kill signal being active, the memory may cause the access operation (e.g., a read operation) on the word line associated with the access address (and the selected address) to fail. For example, responsive to the kill signal at an active level, one or more signals (e.g., activation signal ACT and/or column signal COL) may be masked to prevent proper operation during the access operation and/or one or more bits of the data may be changed (e.g., inverted, randomized, changed to a set value, etc.).

In some embodiments, the method 300 may include comparing the access address to a plurality of repaired addresses and if there is a match, redirecting the access operation to a redundant word line (instead of the word line which would otherwise be associated with the access address). For example, a repair control circuit (e.g., 202 of FIG. 2) may compare the access address to the repaired addresses and provide a signal Match at an active level if there is a match. In some embodiments, the access operation may continue properly if the row has been repaired. For example if the signal Match is active, the signal Kill may be suppressed. The method 300 may include determining if the selected row has been previously repaired and not disabling the selected row if the selected row has been previously repaired The method 300 includes box 330, which describes performing a post-package repair (PPR) operation on the selected row. For example, the method 300 may include identifying the selected row (e.g., with a bad row identification circuit such as 224 of FIG. 2). The identifying may include writing test data to the memory array and reading data to determine if the read data matches the test data. If not, the row address of the read operation which produced non-matching data may be identified as defective. The PPR operation includes providing an address, such as that of the identified selected row, along with PPR commands to a PPR circuit of the memory. The PPR circuit performs a PPR operation by changing the state (blowing) one or more fuses to program the identified/selected address as a repaired address. When the repaired address is accessed, a repair control circuit may direct the access to a redundant row of memory instead.

The method 300 includes box 340, which describes testing the selected row. For example, a controller may write test data to the memory array and read the data to compare the read data to the written data. In some embodiments, as part of the testing operation, the controller (e.g., with repair logic 222) may check to determine if all of the rows properly store the test data now that the selected row is repaired.

Figure 4:
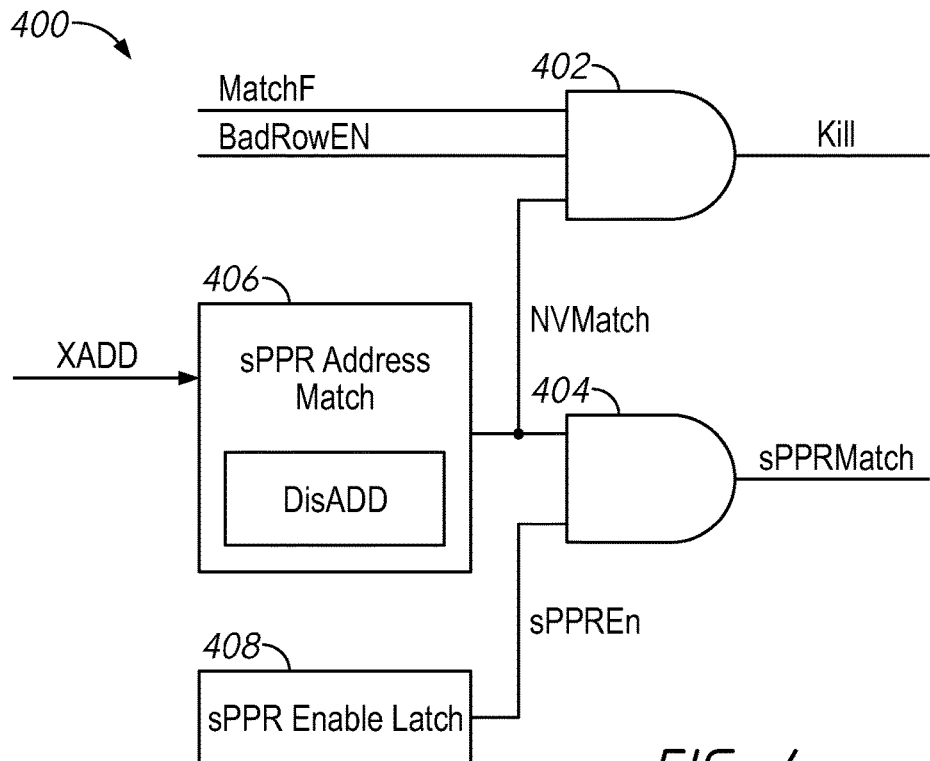
FIG. 4 is a schematic of an example disable control circuit according to some examples of the present disclosure.
Figure 5:
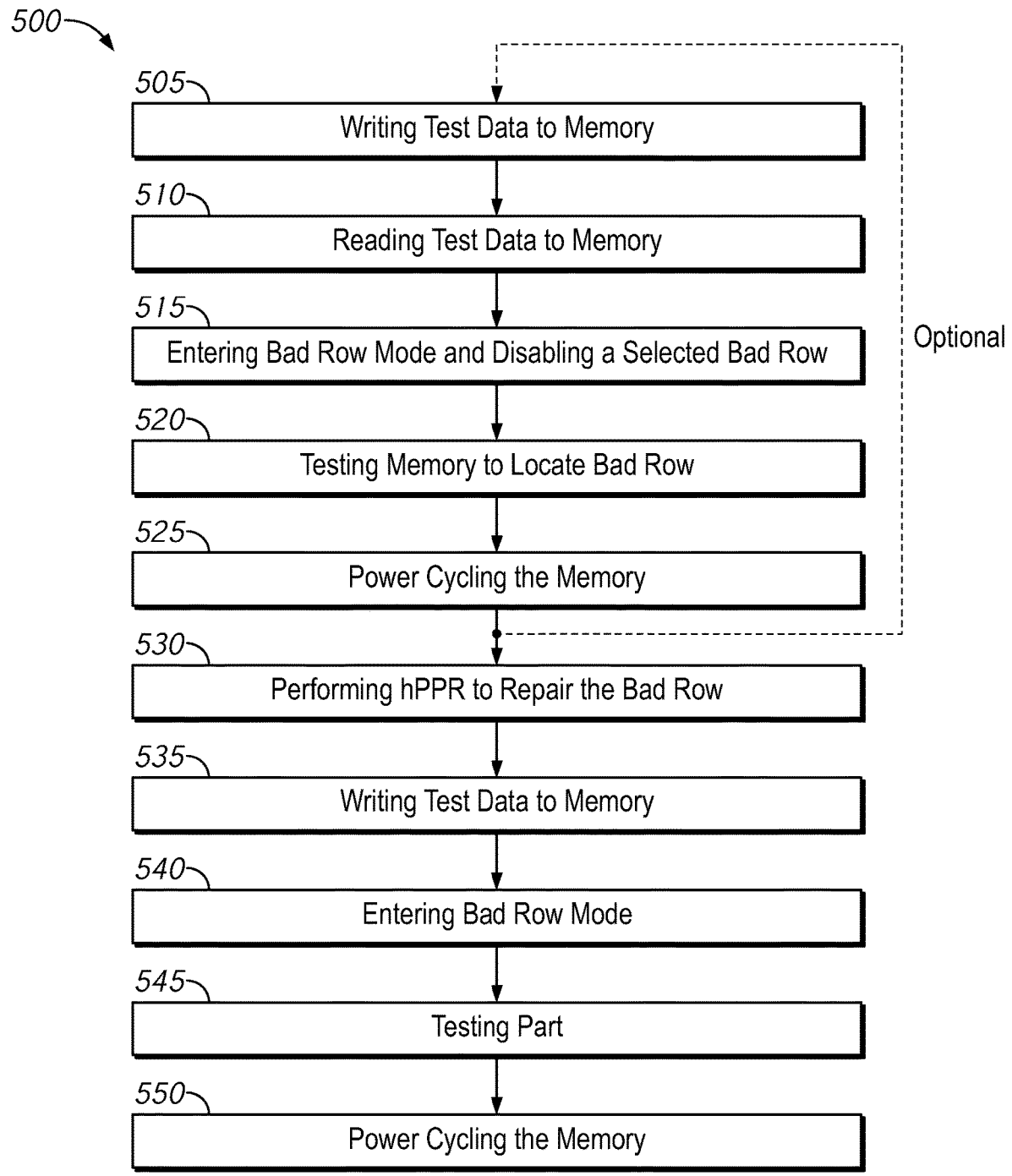
FIG. 5 is a flow chart of a method according to some embodiments of the present disclosure.

FIGS. 4 and 5 illustrate an example embodiment where the selected address is stored in a volatile fashion. For example, once the selected address is disabled, it may only remain disabled until the device is power cycled after which the selected address may no longer be stored in the disable control circuit, and the word line associated with the selected address will no longer be disabled (even if it hasn't otherwise been repaired), until the bad row mode is entered again and that same selected address is used. In the example of FIGS. 4 and 5, circuitry used for sPPR operations may be used to store the selected address.

FIG. 4 is a schematic of an example disable control circuit according to some examples of the present disclosure. The disable control circuit 400 may, in some embodiments, be an implementation of the disable control circuit 116 of FIG. 1 and/or 204 of FIG. 2. The disable control circuit 400 uses address storage, such as latches, which are shared with the sPPR logic. It may be necessary to disable sPPR before entering the bad row mode so as not to cause conflicts between sPPR and the bad row mode operations.

The disable control circuit 400 shows an sPPR address match circuit 406. The sPPR address match circuit 406 includes a latch which stores an address which may be either an address repaired via sPPR or the disable address DisADD. In the configuration shown in FIG. 4, the sPPR address match circuit 406 is storing a disable address DisADD. The sPPR address match circuit 406 receives a row address XADD as part of an access operation, and then provides a signal NVMatch at an active level if the row address XADD matches the stored address (DisADD or an sPPR address).

A logic gate 404 (e.g., an AND gate) provides the signal sPPRMatch if both the signal NVMatch and an sPPR enable signal sPPREn are active. The signal sPPREn may be stored in an sPPR enable latch 408. The signal sPPREn may be active if the sPPR feature of the memory is active (e.g., if at least one address is repaired using sPPR). The signal sPPREn may be inactive during an bad row mode.

A logic gate 402 receives a signal MatchF from repair logic (e.g., repair control circuit 202 of FIG. 2), a bad row mode enable signal BadRowEN, and the signal NVMatch. When all three signals are active, the gate 402 (which may be an AND gate) provides the signal Kill at an active level. Responsive to the signal Kill being at an active level, a proper access operation may be prevented on the word line associated with XADD. For example, a signal such as ACT or COL may be suppressed, the read data may be altered (e.g., replaced with a set pattern such as all 1's, randomized, inverted, etc.), or combinations thereof. The signal BadRowEN may be active when a bad row mode is enabled. The signal MatchF may be active when the row address XADD does not match any previously repaired address (e.g., any address RepADD stored in the fuse array/repair control circuit). The signal NVMatch is active when the sPPR address match circuit detects that the address XADD matches the stored selected address DisADD.

FIG. 5 is a flow chart of a method according to some embodiments of the present disclosure. The method 500 may, in some embodiments, be an implementation of the method 300 of FIG. 3 and may in some embodiments, be implemented using the disable control circuit 400 of FIG. 4. The method 500 may represent an embodiment where volatile storage, such as sPPR latches, are used to store the disable address. The method 500 may represent a specific test protocol using a bad row mode. Other test protocols are possible in other embodiments.

The method 500 includes block 505 which describes writing test data to a memory (e.g., 230 of FIG. 2). For example a controller (e.g., 220 of FIG. 2) may write the test data as part of a test operation. The method 500 includes block 510, which describes reading the test data. The read test data may be compared to written test data to check for errors. At block 510 it may be expected that the read data and written data will match.

The method 500 includes block 515, which describes entering a bad row mode and disabling a selected bad row. The bad row mode may be entered via a command from the controller, such as a multi-purpose command (MPC), writing a value to a mode register, or combinations thereof. In some embodiments, the controller may also provide a disable address (e.g., from a repair test circuit 226). In some embodiments, the disable address may be determined by the memory. The disable address may be stored in volatile memory, such as the sPPR latches (e.g., 406 of FIG. 4). Block 515 may include disabling a bad row in each bank of the memory.

The method 500 may include testing the memory to locate the bad row. For example, a bad row identification circuit (e.g., 224 of FIG. 2) may write and read test data (e.g., analogous to blocks 505 and 510) and check for discrepancies. The bad row may be identified based on the row address where the read data does not match the written test data.

The method 500 includes box 525, which describes power cycling the memory. Since the disable address is stored in volatile memory, this may reset the disabled address (allowing it to function properly again) and exiting the memory from the bad row mode. The method 500 may optionally include repeating steps 505 to 525, for example to ensure that the operation of boxes 505 to 525 is repeatable.

The method 500 may continue with block 530, which describes performing an hPPR operation to repair the bad row. The controller may provide the identified bad row along with instructions to perform an hPPR operation. The memory may program the bad row address into a fuse array in order to remap the bad row address to a redundant word line.

The method continues with block 535, similar to block 505, which describes writing test data to the memory. The method continues with block 540, which describes entering the bad row mode again, similar to block 515. As part of block 540, a selected bad row may be programmed again (since it will have been lost during the power cycling of block 525). Assuming that the memory is operating as intended, the redundant wordline now associated with the selected address will not be disabled, since it has been repaired. The method 500 continues with block 545, which involves reading data from the memory and comparing it to the test pattern. Assuming that the memory is operating as intended, the rows of the memory will all pass, since the bad row has been repaired. The method 500 includes block 550, which describes power cycling the memory to exit the bad row mode, similar to block 525.

Figure 6:
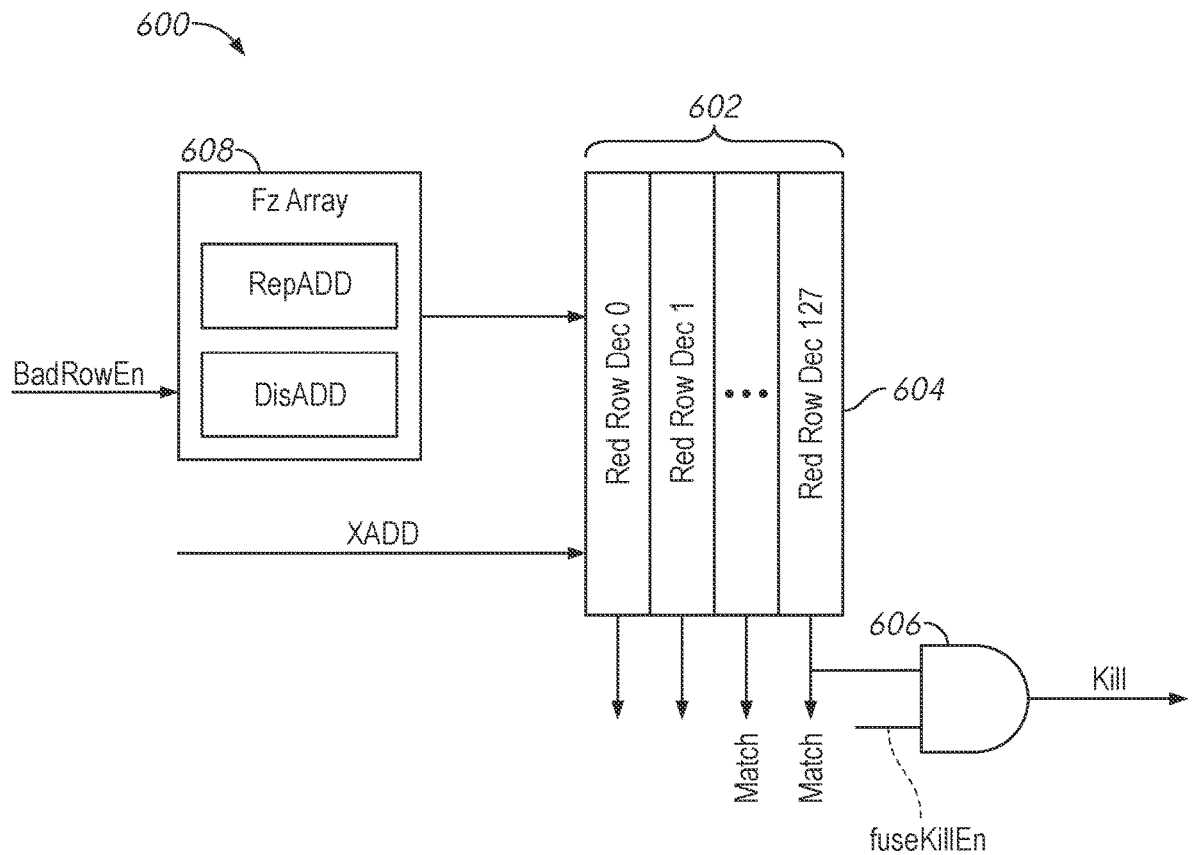
FIG. 6 is a block diagram of a disable control circuit according to some embodiments of the present disclosure.
Figure 7:
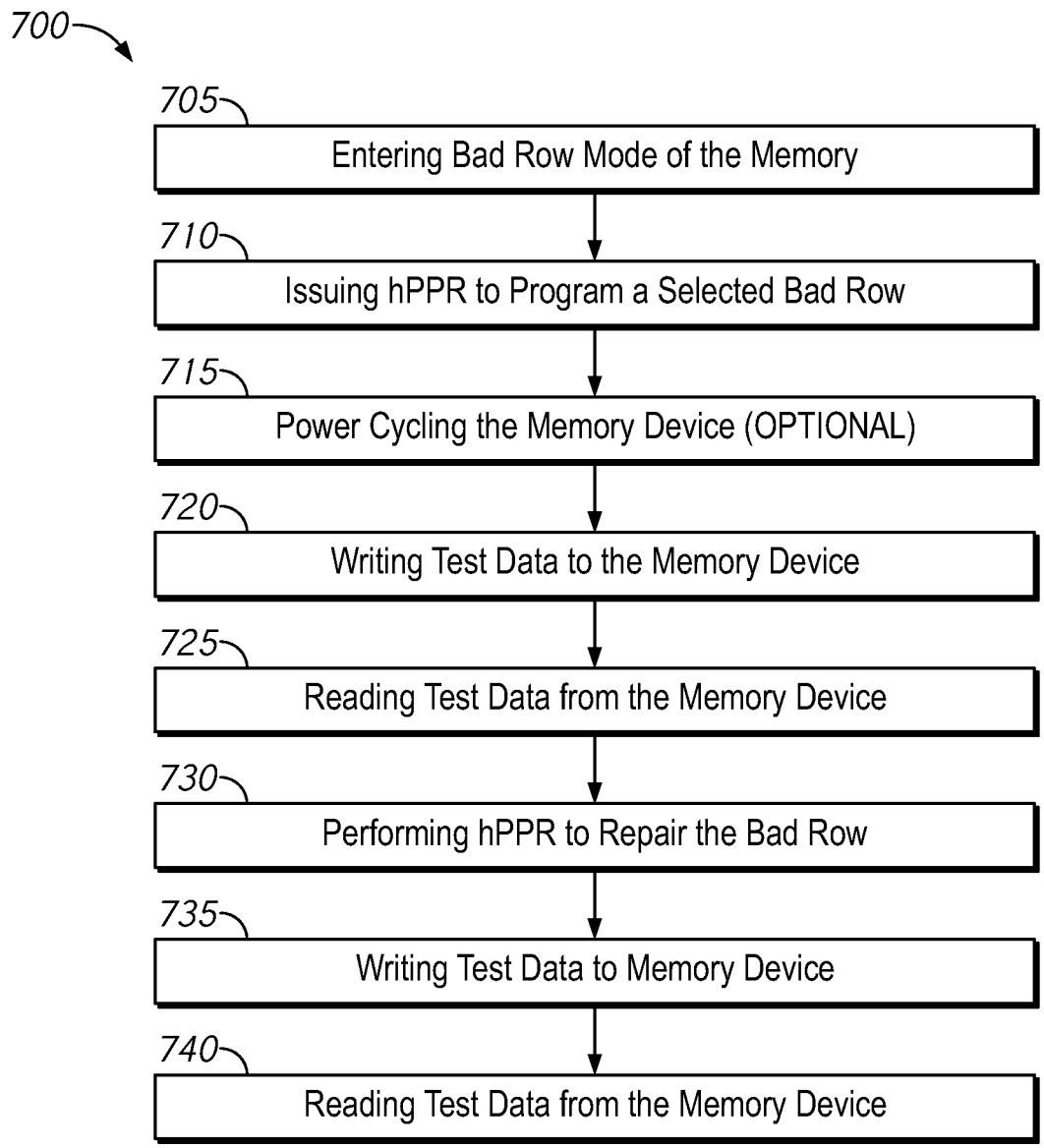
FIG. 7 is a flow chart of a method according to some embodiments of the present disclosure.

FIGS. 6 and 7 represent an embodiment where non-volatile storage is used to record the disable address. For example, the disable address may be programmed into the fuse array (e.g., using hPPR circuits). Accordingly, the word line associated with the disabled address may persistently fail, even through device power cycles, until it is repaired and that address is remapped to a redundant row (e.g., as part of an hPPR operation).

FIG. 6 is a block diagram of a disable control circuit according to some embodiments of the present disclosure. The disable control circuit 600 may, in some embodiments, be an implementation of the disable control circuit 116 of FIG. 1 and/or 204 of FIG. 2. The disable control circuit 600 uses components which are shared with hPPR logic of the memory.

A fuse array 608 stores a number of repair addresses RepADD and a disable address DisADD. The addresses may be programmed into the fuse array by changing the state (e.g., blowing) one or more fuses. The stored addresses are streamed out of the fuse array and stored in redundant decoders 602. Each repair address RepADD and the disable address DisADD may be stored in a different redundant decoder 602 A specific redundant decoder may be set aside for storage of the disable address. In the example embodiment of FIG. 6, there are 128 decoders, and a final decoder Red Row Dec127 604 is assigned for storage of the disable address DisADD. The fuse array 608 receives a bad row enable signal BadRowEn (e.g., from controller 220 of FIG. 2). When the signal BadRowEn is active, the fuse array 608 (and/or fuse logic) may allow the final row decoder Red Row Dec 127 604 to be used for disabling a selected disable address. For example, when the signal BadRowEn is active, a selected address may be written (e.g., via hPPR operation) to the row decoder 604. The signal BadRowEn may indicate that an address (e.g., received from the controller) should be written to the final row decoder 604 and not to one of the other row decoders 602.

The redundant decoders 602 each receive the access address XADD and provide a respective signal Match at an active level if the access address XADD matches the address stored in that latch. Each of the match signals may be associated with a redundant row of memory, and a Match signal being active indicates that that redundant row of memory should be accessed responsive to the address XADD.

When the match signal Match of the row decoder 604 designated for the disable address is active, it indicates that the access address XADD matches the disable address DisADD. A logic gate 606 provides the signal Kill at an active level when the signal Match from the designated decoder 604 is active and when a fuse kill enable signal is active. The fuse kill enable signal fuseKillEn may be a state signal (e.g., based on the states of fuses in the fuse array 608. The fuseKillEn signal may indicate if the memory is allowed to use a bad row mode or not. If the signal fuseKillEn is inactive, then the signal Kill will never be active, and the row decoder 604 may be used as part of normal repair operations. If the signal fuseKillEn is active, then the address stored in the redundant row decoder 604 may be disabled (e.g., by programming an address into the decoder 604 when the signal BadRowEn is active). Responsive to the signal Kill being active, the access operation on the word line associated with XADD may fail.

The addresses RepADD and DisADD stored in the fuse array are stored in a persistent, non-volatile fashion. In other words, the addresses remain stored even when the device is powered down. The addresses RepADD and DisADD may be streamed out to the redundant decoders 602 as part of a power up of the memory. Accordingly, the disable address programmed in the fuse array may be persistent, and the word line associated with the disable address DisADD may continue to fail until that word line is repaired. When a controller identifies the disable address DisADD as defective, the hPPR operation may include disabling the previous repair by changing the fuses which store the disable address DisADD to indicate that "repair" should no longer be used, and reprogramming the address so that it is associated with a new redundant row decoder 602 and therefore a new redundant row of the memory.

FIG. 7 is a flow chart of a method according to some embodiments of the present disclosure. The method 700 may be an implementation of the method 300 of FIG. 3. The method 700 may, in some embodiments, be implemented using the disable control circuit 600 of FIG. 6. Several of the steps of the method 700 may be generally similar to steps of the method 500 of FIG. 5 except that in the method 700, the disable address is programmed into non-volatile storage of the memory and is therefore persistent through power cycling.

The method 700 includes box 705 which describes entering the memory into a bad row mode, for example by having a controller (e.g., 220 of FIG. 2) issue an MPC or write a mode register bit. When the memory is in the bad row mode, a bad row mode enable (BadRowEN) signal may be active. The method 700 includes box 710, which describes issuing an hPPR command to program a selected bad row. The controller (e.g., repair test circuit 226 of FIG. 2) may issue an hPPR command along with a disable address (or alternatively, the disable address may be designated by the memory). The memory (e.g., repair control circuit 202) may perform an hPPR operation to write the disable address into the fuse array. The fuses programmed with the disable address are associated with a redundant row decoder (e.g., 604 of FIG. 6) which is associated with the bad row disable operation. When the bad row mode is active, the address provided along with the hPPR operation may be written to the redundant row decoder associated with the bad row disable operation. In some embodiments, box 710 may include selecting a redundant row element to use as part of the bad row disable operation. The method 700 may include an optional step of box 715, power cycling the memory device. The disable address will remain saved to the memory, since it is persistent.

The method 700 includes box 720 which describes writing test data to the memory array and box 725 which describes reading the test data from the memory array. A bad row identification circuit (e.g., 224 of FIG. 2) of the controller may identify the bad row based on comparing the read data to the written data. During a read operation, the disable control circuit may compare the accessed row address to the stored selected bad row address (e.g., in selected redundant row decoder 604 of FIG. 6) and when there is a match (and bad row mode is enabled) cause the read operation to fail. Accordingly when the controller matches read and written data, then the read data from the selected bad row will not match, and the controller will identify the failed row.

The method 700 includes box 730, performing an hPPR operation to repair the bad row. In some embodiments, prior to performing the steps of box 730, the bad row mode may be deactivated. This may allow the second hPPR to function normally (e.g., to use a redundant row decoder not associated with a bad row disable operation). The controller may issue hPPR commands along with the identified selected address. The memory may disable the previous "repair" (when the disable address was loaded in box 710) so that the address is no longer used in the selected bad row decoder (e.g., 604 of FIG. 6), and program the address so that it is remapped to a redundant row of memory. For example, if one redundant row decoder (e.g., Red Row Dec 127 of FIG. 6) is set aside for the selected bad row, then the address may be programmed into a different redundant row decoder (e.g., Red Row Dec 0 to Red Row Dec 126 of FIG. 6) to remap the address to the redundant row of memory.

The method 700 includes boxes 735 and 740 which describe writing test data to the memory box and reading test data from the memory device. This is similar to the steps 720 and 725, except that this time, the memory should pass.

In some embodiments, rather than being tested by an external controller, a test circuit of the memory may be tested using the bad row mode. For example, a memory (e.g., 102 of FIG. 1 and/or 230 of FIG. 2) may include a built-in self-test circuit (BIST). The BIST circuit may perform functions analogous to the repair logic 222 described with respect to FIG. 2, however the BIST may be located in the memory 230 instead of in the controller 220. Any of the embodiments described herein may be adapted for use with a BIST circuit, which may write and read test data in order to locate defective rows. For example, in the method 700, the steps 720 to 740 may be performed by a BIST circuit located in the memory rather than by a controller of the memory.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. A method comprising:
   entering a memory into a bad row mode to disable a selected row of the memory and test a repair logic configured to detect defective rows of the memory;
   disabling the selected row of the memory, wherein disabling the selected row includes causing the selected row to temporarily appear to be a defective row by causing failure of an access operation on the selected row, and wherein the access operation is caused to fail by changing a value of at least one data bit in the selected row;
   detecting, using the repair logic configured to detect the defective rows of the memory, the selected row as the defective row responsive to the failure of the access operation on the selected row;

performing a post-package repair (PPR) operation on the selected row;

testing an address associated with the selected row; and exiting the memory from the bad row mode, wherein the selected row is disabled only while the memory is in the bad row mode.

2. The method of claim 1, wherein disabling the selected row includes blocking an activate command, a column command, changing data read from the selected row or combinations thereof.

3. The method of claim 1, further comprising determining if the selected row has been previously repaired and not disabling the address associated with the selected row if the selected row has been previously repaired.

4. The method of claim 1, further comprising storing an address associated with the selected row in a fuse array of the memory.

5. The method of claim 1, further comprising storing an address associated with the selected row in a soft PPR (sPPR) latch of the memory.

6. The method of claim 1, wherein the PPR operation includes changing a state of one or more fuses to remap an address associated with the selected row to a redundant row of the memory.

7. The method of claim 1, further comprising:

writing test data to the memory;

reading read data from the memory;

comparing the read data to the test data to identify the selected row; and performing the PPR operation on the identified selected row.

8. An apparatus comprising:

a memory array comprising a plurality of word lines, each associated with one of a plurality of row addresses;

a repair circuit configured to remap a plurality of repaired addresses to a respective one of a plurality of redundant word lines, and a disable control circuit configured to receive a row address, compare the received row address to a selected row address, and provide a kill signal at an active level, wherein responsive to the kill signal at the active level, access operations to a selected word line of the plurality of word lines associated with the selected address are caused to fail to cause the selected row to temporarily appear to be a defective row by changing a value of at least one data bit in the selected word line, wherein, when the apparatus is entered into a bad row mode to disable the selected word line and test a repair logic configured to detect defective rows of the memory array, the selected word line is detected as the defective row responsive to a failure of an access operation on the selected row, the disable control circuit disables the selected word line, and the repair circuit performs a post-package repair (PPR) operation on the selected word line, and wherein, when the apparatus is exited from the bad row mode, the selected word line is not disabled.

9. The apparatus of claim 8, wherein if the selected row address matches one of the plurality of repaired addresses, the kill signal is not provided at an active level.

10. The apparatus of claim 8, wherein the disable control circuit stores the selected address in a soft PPR latch.

11. The apparatus of claim 8, wherein the selected row address is stored in a fuse array and a redundant row decoder.

12. The apparatus of claim 8, wherein the kill signal is provided at the active level only when the received row address matches the selected row address and a bad row mode enable signal is active.

13. A system comprising:

a memory comprising:

a repair circuit configured to remap a plurality of repaired addresses to a respective one of a plurality of redundant word lines;

a disable control circuit configured to prevent read operations to a word line associated with a selected address when the memory is in a bad row mode to disable the word line and test a repair logic configured to detect defective rows of the memory, wherein the disable control circuit is configured to cause failure of an access operation on the word line associated with the selected address to cause the word line to temporarily appear to be a defective row by changing a value of at least one data bit in the selected word line; and a controller comprising:

a repair test circuit configured to enter the memory into the bad row mode, and a bad row identification circuit configured to test the memory to identify the word line as the defective row based on the failure of the access operation and perform a post package repair (PPR) operation on the selected address, wherein after the PPR operation the selected address is one of the plurality of repaired addresses, wherein the word line associated with the selected address is disabled when the memory is in the bad row mode, and wherein the word line associated with the selected address is not disabled when the memory is exited from the bad row mode.

14. The system of claim 13, wherein the disable control circuit is configured to not prevent read operations to the word line associated with the selected address if the selected address is one of the plurality of repaired addresses.

15. The system of claim 13, wherein the repair test circuit is configured to provide the selected address.

16. The system of claim 13, wherein the repair test circuit is configured to enter the memory into the bad row mode by providing a multi-purpose command, writing a value to a mode register of the memory, changing a fuse setting of the memory, or combinations thereof.

17. The system of claim 13, wherein the memory is configured to store the selected address in a soft PPR latch.

18. The system of claim 13, wherein the memory is configured to store the selected address in a fuse array.

19. The method of claim 1, wherein changing the value of the at least one data bit in the selected row comprises inverting values of data bits in the selected row.

20. The method of claim 1, wherein changing the value of the at least one data bit in the selected row comprises randomizing multiple bits in the selected row.

21. The method of claim 1, wherein changing the value of the at least one data bit in the selected row comprises replacing multiple bits in the selected row with a set pattern.

* * * * *

UNITED STATES PATENT AND TRADEMARK OFFICE
CERTIFICATE OF CORRECTION

PATENT NO. : 11,915,775 B2
APPLICATION NO. : 17/449297
DATED : February 27, 2024
INVENTOR(S) : Jack Riley et al.

It is certified that error appears in the above-identified patent and that said Letters Patent is hereby corrected as shown below:

In the Claims

Column 15, Line 38, change "a plurality of redundant word lines, and" to --a plurality of redundant word lines; and--

Column 16, Line 24, change "the bad row mode, and" to --the bad row mode; and--

Signed and Sealed this
Twelfth Day of November, 2024

*Katherine Kelly Vidal*

Katherine Kelly Vidal
*Director of the United States Patent and Trademark Office*